United States Patent [19]
Yoo

[11] Patent Number: 5,617,366
[45] Date of Patent: Apr. 1, 1997

[54] METHOD AND APPARATUS FOR A TEST CONTROL CIRCUIT OF A SEMICONDUCTOR MEMORY DEVICE

[75] Inventor: Jei-Hwan Yoo, Kyungki-do, Rep. of Korea

[73] Assignee: Samsung Electronics Co., Ltd., Suwon, Rep. of Korea

[21] Appl. No.: 570,868

[22] Filed: Dec. 12, 1995

[30] Foreign Application Priority Data

Dec. 13, 1994 [KR] Rep. of Korea ............... 33913/1994

[51] Int. Cl.$^6$ .................................................. G11C 7/00
[52] U.S. Cl. ............................. 365/201; 365/225.7
[58] Field of Search .......................... 365/200, 201, 365/225.7, 189.01; 371/21.1, 21.2, 21.3

[56] References Cited

U.S. PATENT DOCUMENTS

| | | | |
|---|---|---|---|
| 5,140,554 | 8/1992 | Schreck et al. | 365/201 |
| 5,228,000 | 7/1993 | Yamagata | 365/201 |
| 5,270,983 | 12/1993 | Wuertz et al. | 365/225.7 |

OTHER PUBLICATIONS

"A 90ns 1Mb DRAM with Multi–Bit Test Mode", by Masaki Kumanoya, Kazuyasu Fujishima, Katsuhiro Tsukamoto, Yasumasa Nishimura, Kazunori Saito, Takayuki Matsukawa, Tsutomu Yoshihara, Takao Nakano 1985 IEEE International Solid–State Circuits Conference, pp. 240–241.

*Primary Examiner*—David C. Nelms
*Assistant Examiner*—Vu A. Le

[57] ABSTRACT

A test control circuit and method for performing a standardized test in a semiconductor memory device which has a structure such that it is difficult to perform a test operation using a standardized test mode. The test control method of a semiconductor memory device includes the steps of: arranging in the memory device a fuse capable of being electrically blown; receiving a plurality of external input signals applied to the memory device; generating a blocking signal based on the plurality of external input signals and the status of the electrical fuse; generating a parallel test enable signal based on the blocking signal and the plurality of external input signals, wherein, when the blocking signal is of a first logic level, the parallel test enable signal will indicate performance under either a parallel test mode or a normal operation mode based on the plurality of external input signals, and when the blocking signal is of a second logic level, the fuse is blown and the parallel test enable signal permanently indicates operation in a normal opreration mode.

8 Claims, 2 Drawing Sheets

5,617,366

METHOD AND APPARATUS FOR A TEST CONTROL CIRCUIT OF A SEMICONDUCTOR MEMORY DEVICE

BACKGROUND OF THE INVENTION

The present invention relates to a test control circuit and method of a semiconductor memory device. In particular, the present invention relates to a test control circuit and method for performing a standardized test in a semiconductor memory device which has a structure that makes it difficult to perform a standard test-mode test operation following production.

To ensure the reliability of a semiconductor memory device, semiconductor manufacturers generally perform a variety of tests on completed memory devices, either in a wafer state or a package state. Currently, the time required to complete this testing is proportionally large, compared to the actual production time for the memory devices. This increased testing time also leads to a corresponding increase in the amount of resources used in testing, e.g., equipment, time, human efforts and so on. The added time and resources required for testing ultimately increase both the final cost and the final speed of production for the finished memory device.

To solve the foregoing problems, JEDEC (Joint Electron Device Engineering Council) has proposed standardized test methods for a typical dynamic memory. An example of one of these test methods, a parallel test method, is shown in FIG. 1. This testing is performed under a timing scheme referred to as a $\overline{W}$ & $\overline{C}$ before $\overline{R}$ (WCBR) mode. The parallel test method satisfies the WCBR condition during a time interval T1 of FIG. 1, and can reduce the test time by simultaneously performing tests throughout a plurality of bits in a read/write operation for cells provided within the semiconductor memory during a time interval T2. A signal $\overline{R}$ used in FIG. 1 represents a row address strobe signal $\overline{RAS}$ and a signal $\overline{C}$ represents a column address strobe signal $\overline{CAS}$. A signal ΦPTE represents a parallel test enable signal and a signal $\overline{W}$ represents a write signal. Signals ΦR, ΦC, and ΦW respectively represent inverted signals of the signals $\overline{RAS}$, $\overline{CAS}$, and $\overline{W}$, each being delayed through a buffer.

An example of this parallel test method, known to those skilled in the art, is disclosed in Masaki Kumanoya, et al., "A 90ns IMb DRAM with Multi-bit Test Mode", pp. 240–241, "1985 IEEE INTERNATIONAL SOLID-STATE CIRCUITS CONFERENCE DIGEST OF TECHNICAL PAPERS."

The use of the specific timing described above, i.e., using the WCBR mode to control the timing of a parallel test, has been confined to products conforming to the JEDEC standards. Accordingly, for example, since the 16M memory sets the WCBR mode as the condition for entry into a parallel test mode, a 16M DRAM memory having a 16 multi-bit input and output (I/O) structure cannot perform the parallel test under the WCBR mode. In addition, other non-parallel tests methods require such a prolonged test time as to make them inadequate for the test of a large memory device. It is very desirable, therefore, to create conditions that allow testing of a large memory device using WCBR timing. However, since the WCBR timing is not standardized, a common memory controller having a control function for a common memory may malfunction.

SUMMARY OF THE INVENTION

It is therefore an object of the present invention to provide a test control circuit and method of a semiconductor memory device capable of being free of the foregoing conventional problems.

It is another object of the present invention to provide a method and apparatus for a test control circuit of a semiconductor memory device which is capable of freely executing a parallel test in a semiconductor memory device having a structure that makes it difficult to perform testa using a standardized test mode, provides no limit to a memory controller.

It is yet another object of the present invention to provide a test control method of a semiconductor memory device which is capable of performing a parallel test by entering a specific mode such as, for example, a WCBR mode in a memory device product, and preventing a user from performing the parallel test after completing the parallel test.

It is still another object of the present invention to provide a test control circuit of a semiconductor memory device which is capable of performing a parallel test by diminishing the number of data output pins in a dynamic memory, and enabling all data to be outputted through all of data output pins of an integrated circuit during the parallel test.

These and other objects can be achieved according to the present invention with a test control method of a semiconductor memory device comprising the steps of: arranging in the memory device a fuse capable of being electrically blown; receiving a plurality of external input signals applied to the memory device; generating a blocking signal based on the plurality of external input signals and the status of the electrical fuse; generating a parallel test enable signal based on the blocking signal and the plurality of external input signals, wherein, when the blocking signal is of a first logic level, the parallel test enable signal will indicate performance under either a parallel test mode or a normal operation mode based on the plurality of external input signals, and when the blocking signal is of a second logic level, the fuse is blown and the parallel test enable signal permanently indicates operation in a normal opreration mode.

Further, these and other objects can be achieved according to the present invention with a test control circuit of a semiconductor memory device comprising: mode signal generating means for receiving and logically combining external input signals in order to provide a mode signal; fusing signal generating means for receiving the mode signal and an address signal and provide a fusing signal in response to the address signal and the mode signal; blocking signal generating means comprising a fuse capable of being electrically blown, the blocking signal generating means for generating a blocking signal having a first logic level when the fuse is active and the memory is in a parallel test mode, and having a second logic level when the fuse is blown; and test signal generating means for generating a parallel test enable signal instructing the performance of a parallel test, based on the blocking signal and the external input signals, wherein the fusing signal instructs the blocking signal generating means to blow the fuse in the blocking signal generating means upon advancing to a normal operation mode, and wherein the test signal generating means disables the parallel test enable signal when the blocking signal is of the second logic level, thus stopping any further parallel testing.

BRIEF DESCRIPTION OF THE DRAWINGS

A more complete appreciation of this invention, and many of the attendant advantages thereof, will be readily apparent with reference to the following detailed description when considered in conjunction with the accompanying drawings, in which like reference symbols indicate the same or similar elements components, wherein.

DETAILED DESCRIPTION OF THE PREFERRED EMBODIMENTS

The following text describes a test control circuit and method according to a preferred embodiment of the present invention. It will be apparent, however, to one skilled in the art that the invention may be practiced without their specific details. The description will omit detailed descriptions on known functions and constructions that would unnecessarily obscure the subject matter of the present invention.

Figure 1:
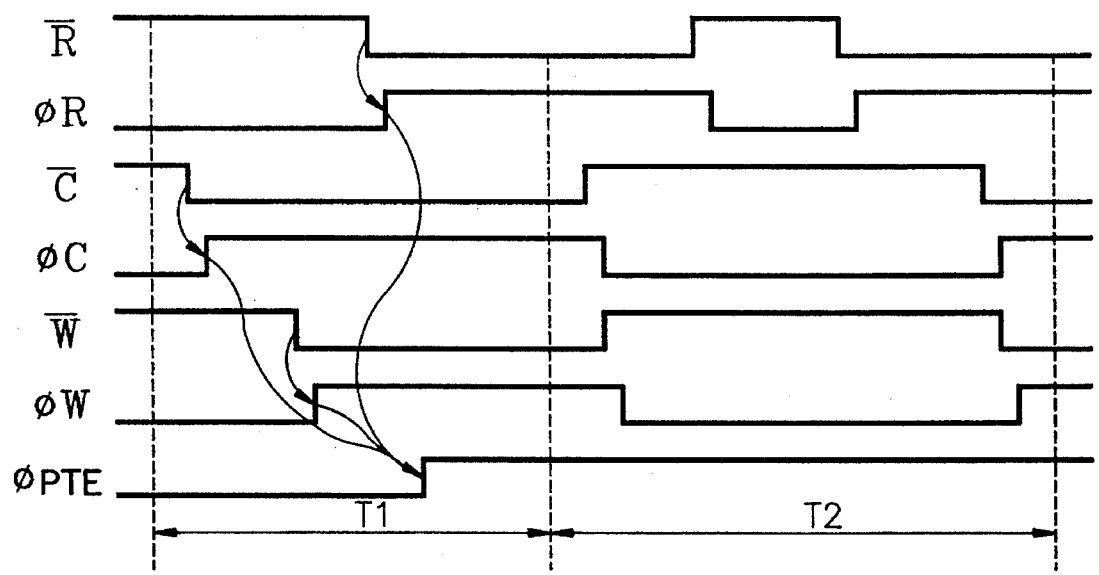
FIG. 1 is a timing diagram illustrating WCBR of a conventional test mode.
Figure 2:
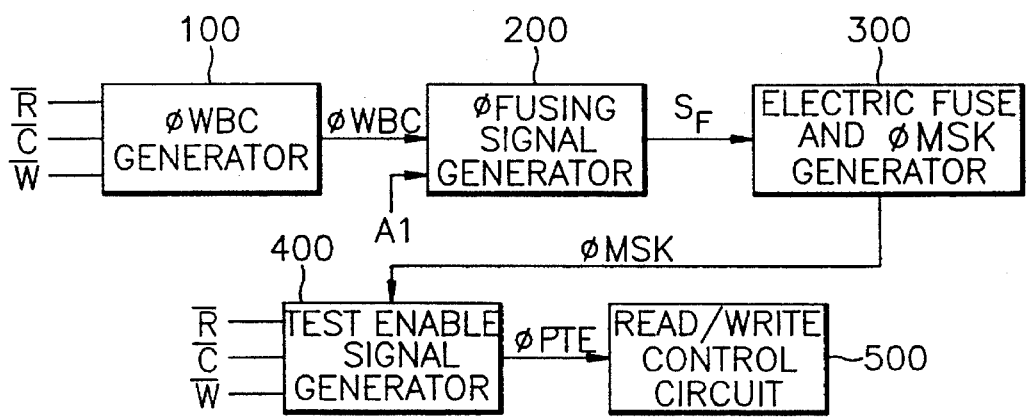
FIG. 2 is a block diagram illustrating a test control circuit according to a preferred embodiment of the present invention.

FIG. 2 is a block diagram illustrating a test control circuit according to a preferred embodiment of the present invention. The test control circuit comprises a ΦWBC generator 100, a Φ fusing signal generator 200, a ΦMSK generator 300, a test enable signal generator 400 for WCBR, and a read/write control circuit 500. The ΦMSK generator 300 further comprises an electric fuse 31 that enables the parallel test mode and is electrically blown to exit the parallel test mode and enter the normal operation mode. This preferred embodiment employs the WCBR timing described above with reference to FIG. 1.

Referring to FIG. 2, the ΦWBC generator 100 receives and combines external input signals $\overline{R}$, $\overline{W}$, and $\overline{C}$ and provides a mode signal ΦWBC to the fusing signal generator 200. The mode signal ΦWBC indicates whether the memory should be in a conventional operation mode or a parallel test mode. The Φ fusing signal generator 200 receives both the mode signal ΦWBC and an address signal $A_1$, and provides a fusing signal $S_F$ for blowing the electric fuse 31 in the ΦMSK generator 300. The fusing signal $S_F$ instructs the ΦMSK generator 300 to blow the electric fuse 31 upon entering the normal operation mode, based on the status of the mode signal ΦWBC, and the address signal $A_1$. The ΦMSK generator 300 generates a blocking signal ΦMSK, which depends upon the mode of operation, as determined by the status of the electrical fuse 31. When the fuse 31 is connected, the signal ΦMSK is of a first logic level indicating the parallel test mode. When the fuse 31 is blown, the signal ΦMSK is of a second logic level indicating the normal operation mode.

When the memory is in a parallel test mode, and the signal ΦMSK is thus at the first logic level, the test enable signal generator 400 logically combines the blocking signal ΦMSK with the external input signals $\overline{R}$, $\overline{C}$, and $\overline{W}$, and produces the parallel test enable signal ΦPTE. When the test enable generator has completed the parallel test, and the signal ΦMSK is thus at the second logic level, the test enable signal generator 400 disables the parallel test enable signal ΦPTE, stops any further parallel testing. The memory then enters into a normal operation mode.

In accordance with the timing shown in FIG. 1, the test enable signal generator 400 in this embodiment preferably generates a parallel test enable signal, ΦPTE to the read/write control circuit 500 only when it has received high values for the signals ΦR, ΦC, and ΦW, i.e., when the signals $\overline{R}$, $\overline{C}$, and $\overline{W}$ are low, and a high value for the signal ΦMSK. When the read/write control circuit 500 receives a proper parallel test enable signal ΦPTE, it performs the test for a memory cell by any acceptable method, e.g., using a x16 method or the like.

As is well-known in the art, the parallel test is preferably performed using a method defined by the JEDEC standard. The test is performed by ignoring an address corresponding to least significant bits (hereinafter, referred to as LSB) between an address not used by certain modes (x1, x4, x8, etc.) and a column address, comparing the cell data by modes, such as x16 and x32 modes, and checking the result of the comparison. By way of example, the mode such as x1, x4, x8 is determined by the number of data inputs and outputs which is inputted and outputted in reading and writing the data in the 16M DRAM, whereas the x16 mode is determined in the parallel test. That is why information for a defective cell and redundancy type address information for repair do not coincide on a one to one basis. Regardless of this, the aim of the present invention focuses on providing a test control circuit and method for performing a parallel test in the semiconductor memory device where it is impossible to enter a standardized parallel test mode.

Figure 3:
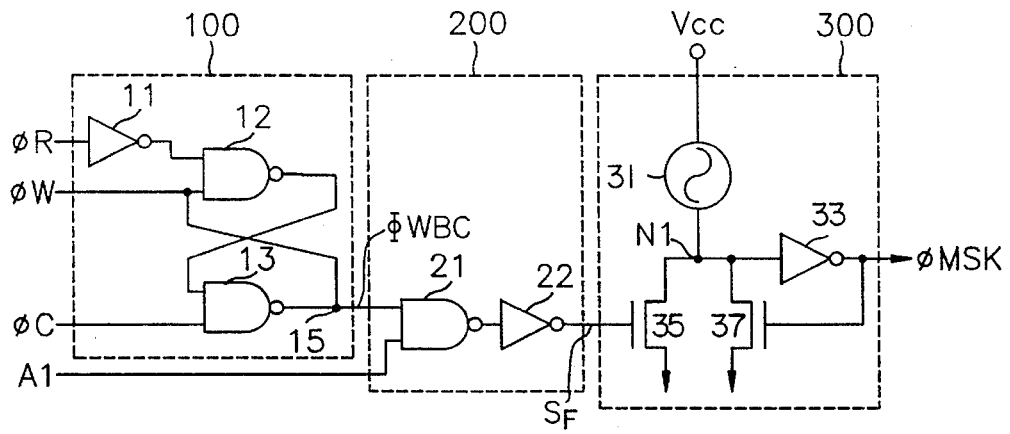
FIG. 3 is a detailed circuit diagram illustrating preferred embodiments of blocks 100, 200 and 300 shown in FIG. 2.
Figure 4:
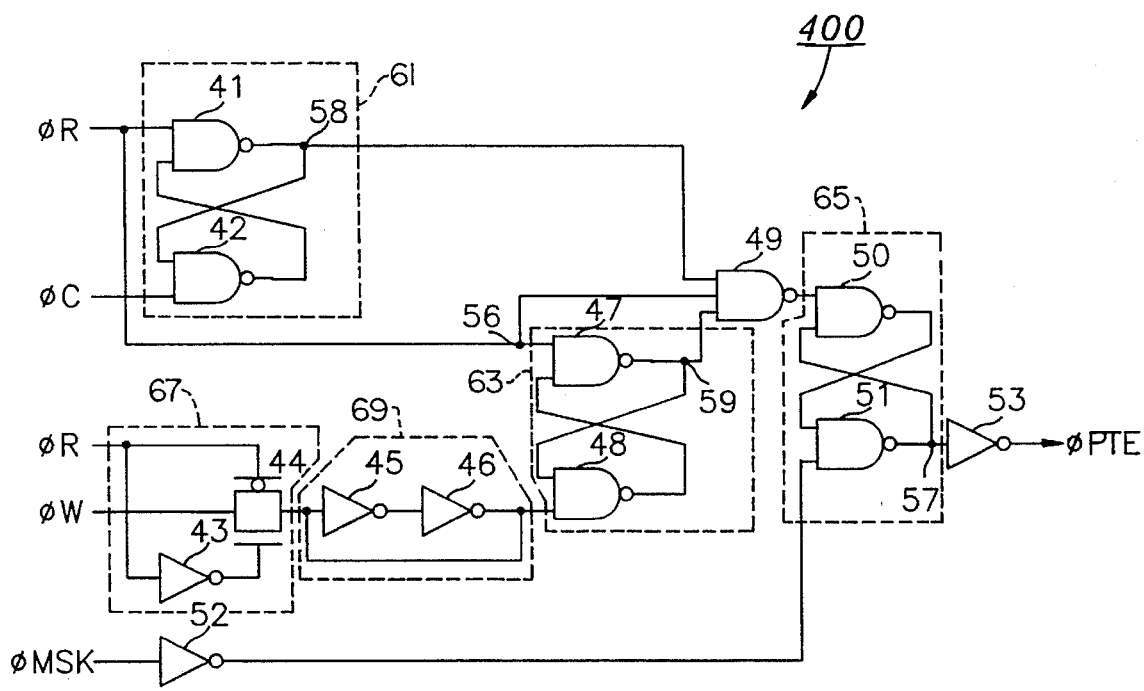
FIG. 4 is a detailed circuit diagram illustrating a preferred embodiment of the test enable signal generator 400 shown in FIG. 2.

FIG. 3 is a detailed circuit diagram illustrating the ΦWBC generator 100, the Φ fusing signal generator 200, and the ΦMSK generator 300 of the preferred embodiment shown in FIG. 2. FIG. 4 is a detailed circuit diagram illustrating the test enable signal generator 400 of the preferred embodiment shown in FIG. 2.

As shown in FIG. 3, the ΦWBC generator 100 includes a first inverter 11 and first and second NAND gates 12 and 13. The signal ΦR is applied through the first inverter 11 to one input of the first NAND gate 12. The signal ΦW, coupled with an output node 15 of the second NAND gate 13, is applied to the other input of the NAND gate 12. The output of the first NAND gate 12 is then provided as one input to the second NAND gate 13. The signal ΦC is then applied to the other input of the second NAND gate 13, and the mode signal ΦWBC is generated at the output node 15 of the second NAND gate 13.

The Φ fusing signal generator 200 includes a third NAND gate 21 and a second inverter 22. One input of the third NAND gate 21 is coupled to the output node 15 of the second NAND gate 13, i.e., the mode signal ΦWBC. Another input of the third NAND gate 21 is coupled to the signal $A_1$. The signal $A_1$ is preferably provided through an address pin of the memory device. The output of the third NAND gate 21 is provided to the input of the second inverter 22. The second inverter 22 outputs the signal $S_F$, indicating whether the electrical fuse 31 should be blown.

The value of the signal $A_1$ indicates when the memory is in a test mode and when it enters into normal operation mode. In the preferred embodiment, the second inverter 22 outputs a logic "low" level during the test mode and a logic "high" level as a fusing signal instructing the ΦMSK generator 300 to cut the electric fuse 31 and enter the memory into the normal operation mode.

The electric fuse 31 in the ΦMSK generator 300 has one terminal connected to a power supply voltage Vcc, and the other terminal connected to a node N1. The node N1 is also connected to the drain of a first NMOS transistor 35, the drain of a second NMOS transistors 37, and an input terminal of a third inverter 33. The gate of the first NMOS transistor 35 is connected to an output of the second inverter 22 and the source of the first NMOS transistor 35 is connected to ground. The gate of the second NMOS transistor 37 is connected with an output of the third inverter 37 and the source of the second NMOS transistor 37 is connected to ground. An output signal of the third inverter 39 becomes the blocking signal ΦMSK, which is provided to the test enable signal generator 400 to indicate the mode of operation for the memory.

As shown in FIG. 4, the test enable signal generator 400 for the WCBR comprises a first latch 61, a second latch 63, a third latch, 65, a complementary transmission gate 67, an inverter chain 69, a fourth inverter 52, a fifth inverter 53, and a three-input NAND gate 49.

The complementary transmission gate 67 comprises a sixth inverter 43 and a CMOS transistor 44. The CMOS transistor 44 is connected to the signal ΦW at its drain terminal and the input of the inverter chain 69 at its source terminal. The CMOS transistor 44 receives the signal ΦR and the inverse of the signal ΦR, inverted by the sixth inverter 43, at its p-channel transmission gate and its n-channel transmission gate, respectively.

The serial chain 69 comprises seventh and eighth inverters 45 and 46 connected in series, the output of the seventh inverter 45 being connected to the input of the eighth inverter 46. In addition, the output of the eighth inverter 46 is turned back to connect to the input of the seventh inverter 45. The serial chain 69 has as its input the input of the seventh inverter 45, and has as its output the output of the eighth inverter 46.

The first latch 61 preferably comprises fourth and fifth NAND gates 41 and 42 connected as an S-R latch. The first latch 61 accepts the signal ΦR as its SET signal, and the signal ΦW as its REST signal. The second latch 63 preferably comprises sixth and seventh NAND gates 47 and 48 connected as an S-R latch. The second latch 63 accepts the signal ΦR as its SET signal, and the output of the inverter chain 69 as its RESET signal. The three-input NAND gate 49 recevies as its inputs the signal ΦR, the output of the first latch 61, and the output of the second latch 63.

The third latch 65 preferably comprises eighth and ninth NAND gates 50 and 51 connected as an S-R latch. The third latch 67 accepts the output of the three-input NAND gate 49 as its SET signal, and the inverse of the signal ΦMSK, provided by the fourth inverter 52, as its RESET signal. The fifth inverter 53 inverts the output of the third latch 65, and thus provides the parallel test enable signal ΦPTE.

An explanation on overall operation of the test control circuit according to the preferred embodiment of the present invention will now be given with reference to FIG. 3. In this embodiment, the electric fuse 31 is preferably made of polysilicon, requiring no additional process in the conventional memory fabrication process. The fuse 31 is prefereably designed such that if a current greater than a constant current density is flowed into the polysilicon, the electric fuse will be blown and the connection cut. The preferred embodiment, as described above, forms the electric fuse 31 in the memory IC during fabrication, and performs testing at a wafer level or a package level through a specific timing method such as the WCBR mode. When the final test, is performed another specific condition is set, the electric fuse 31 is then supplied with the required excess current, and the electric fuse is blown. When the electric fuse 31 is blown, even if the specific timing for the parallel test is provided by the user, the memory exits to a normal operation mode. Once the electric fuse 31 is blown, the memory cannot remain in the parallel test mode, and performs no additional parallel testing.

Before the fuse is blown, the memory circuit operates as follows. First, the output signal ΦMSK of the ΦMSK generator 300 is maintained to a logic "low" level. Accordingly, when the signals $\overline{R}$, $\overline{C}$, and $\overline{W}$ applied to external pins of the memory integrated circuit satisfy the WCBR condition, the parallel test enable signal ΦPTE changes from the logic "low" level to a logic "high" level, and the memory enters the test mode. The logic "high" ΦPTE signal is applied to the read/write control circuit 500 so that the parallel read or write operation can be performed with the same data upon read or write operations of a next cycle.

When the parallel test is about to end in the final test step, the combination of the WBC timing and the signal $A_1$, i.e., the blocking signal ΦMSK, is changed from a logic "low" level to a logic "high" level. To accomplish this, the outputs of the ΦWBC generator 100 and the fusing signal generator 200 respectively go to the logic "high" level, causing tens of miliiamperes of current to pass through the first NMOS transistor 35 and through the electric fuse 31. This blows the electric fuse 31 and cuts the connection between the power source $V_{cc}$ and the node N1. As a result, the voltage at the node N1 in the ΦMSK generator 300 changes from a logic "high" level to a logic "low" level, which in turn causes the blocking signal ΦMSK to have the logic "high" level.

After the electric fuse 31 is blown, despite the fact that test enable signal generator 400 satisfies the WCBR condition, the parallel test cannot be performed. The "high" level ΦMSK signal instructs the test enable signal generator 400 to output a "low" ΦPTE signal. At this time, the user can no longer enter the parallel test mode.

Alternate embodiments may be constructed in semiconductor memory devices having a multi-bit I/O structure. In other words, this invention can reduce the number of the external pins by $$\frac{1}{4} \text{ or } \frac{1}{8}.$$

Also, with the above method, the number of IC chips capable of being tested at the same time can be increased. Of course, in such a case, once the electric fuse 31 is blown in the final test step after performing the main test in the wafer or package level, all of IC memories can be normally outputted through the overall I/O.

As is apparent from the foregoing, method and apparatus for a test control circuit of a semiconductor memory device of the current invention can freely execute a parallel test in a semiconductor memory device having a structure that makes it difficult to perform a parallel test using a standardized test mode. Also, it provides an advantage in that the parallel test is performed by entering a specific mode in a memory device product, e.g., a WCBR mode. This can prevent the user from unwittingly entering the test mode, can reduce the total test time, and can ensure the reliability and security of the semiconductor memory device. In addition, the present invention can be embodied in the dynamic memory which enables the data to be outputted through all of data output pins of the integrated circuit upon performing the standardized parallel test.

The present invention is not limited to the above-described embodiments. Various changes and modifications may be effected by one having an ordinary skill in the art and remain within the scope of the invention, as defined by the appended claims.

What is claimed is:

1. A test control method for a semiconductor memory device, comprising the steps of:

arranging in the memory device a fuse capable of being electrically blown;

receiving a plurality of external input signals applied to the memory device;

generating a blocking signal based on the plurality of external input signals and the status of the electrical fuse;

generating a parallel test enable signal based on the blocking signal and the plurality of external input signals, wherein, when the blocking signal is of a first logic level, the parallel test enable signal will indicate performance under either a parallel test mode or a normal operation mode based on the plurality of external input signals, and when the blocking signal is of a second logic level, the fuse is blown and the parallel test enable signal permanently indicates operation in a normal opreration mode.

2. The test control method as claimed in claim 1, wherein the parallel test mode uses a WCBR ($\overline{W}$ & $\overline{C}$ before $\overline{R}$) timing.

3. The test control method as claimed in claim 1, wherein the second logic level is a logic "high" state in the first logic level is in a logic "low" state.

4. The test control method as claimed in claim 1, wherein the parallel test enable signal is maintained at the second logic level upon performing the parallel test and is maintained in the first logic level upon completing the parallel test.

5. The test control method as claimed in claim 1, wherein the fuse is fused by combining a signal of the second logic level provided through an address pin of the memory device and an output logic signal under the WCBR mode.

6. A design method of a dynamic memory for performing a parallel test in a wafer or package state, comprising the steps of:

repeatedly performing the parallel test upon the setting of a first specific timing;

setting the first specific timing in a final test; and blowing an electric fuse positioned in the dynamic memory after the final test so that the parallel test is not performed upon the setting the first specific timing.

7. A design method of a memory circuit having a plurality of input/output pins for performing read/write operations on a memory in a wafer or package state, comprising the steps of:

performing a read/write operation on the memory with a part of the plurality of input/output pins when a first specific timing is set;

setting the first specific timing in a final test; and blowing an electric fuse positioned in the memory circuit after the final test so that read/write operations are performed with all input/output pins.

8. A test control circuit of a semiconductor memory device, comprising:

mode signal generating means for receiving and logically combining external input signals in order to provide a mode signal;

fusing signal generating means for receiving the mode signal and an address signal and provide a fusing signal in response to the address signal and the mode signal;

blocking signal generating means comprising a fuse capable of being electrically blown, the blocking signal generating means for generating a blocking signal having a first logic level when the fuse is active and the memory is in a parallel test mode, and having a second logic level when the fuse is blown; and test signal generating means for generating a parallel test enable signal instructing the performance of a parallel test, based on the blocking signal and the external input signals, wherein the fusing signal instructs the blocking signal generating means to blow the fuse in the blocking signal generating means upon advancing to a normal operation mode, and wherein the test signal generating means disables the parallel test enable signal when the blocking signal is of the second logic level, thus stopping any further parallel testing.

* * * * *